US012606906B1

(12) United States Patent  
Pinneo

(10) Patent No.: US 12,606,906 B1  
(45) Date of Patent: Apr. 21, 2026

(54) DIAMOND GROWTH ON COMPOSITE SUBSTRATE

(71) Applicant: NPIP Holdings PLCC, Antwerp (BE)

(72) Inventor: John Michael Pinneo, Sonora, CA (US)

( * ) Notice: Subject to any disclaimer, the term of this patent is extended or adjusted under 35 U.S.C. 154(b) by 0 days.

(21) Appl. No.: 18/765,312

(22) Filed: Jul. 7, 2024

Related U.S. Application Data

(60) Provisional application No. 63/512,492, filed on Jul. 7, 2023.

(51) Int. Cl.
  *C23C 16/27* (2006.01)
  *C23C 16/56* (2006.01)

(52) U.S. Cl.
  CPC .......... *C23C 16/274* (2013.01); *C23C 16/278* (2013.01); *C23C 16/56* (2013.01)

(58) Field of Classification Search
  CPC ..... C23C 16/27; C23C 16/274; C23C 16/278; C23C 16/56
  See application file for complete search history.

(56) References Cited

U.S. PATENT DOCUMENTS

| | | | | |
|---|---|---|---|---|
| 7,687,146 B1 * | 3/2010 | Freitas, Jr. | ............ | B82B 3/0019 |
| | | | | 428/408 |
| 2005/0186345 A1 * | 8/2005 | Shibata | ................. | C25B 11/051 |
| | | | | 427/249.7 |

FOREIGN PATENT DOCUMENTS

| | | | | | |
|---|---|---|---|---|---|
| CN | 101673655 | A | * | 3/2010 | .............. H01J 37/32 |
| CN | 112981535 | A | * | 6/2021 | ........... C23C 14/028 |
| JP | 3212057 | | * | 7/2001 | .............. C23C 16/27 |
| JP | 2016-506450 | A | * | 3/2016 | .............. C23C 16/27 |
| JP | 2021-142575 | | * | 9/2021 | .............. B23B 27/14 |
| JP | 7379921 | | * | 11/2022 | .............. B23B 27/14 |

OTHER PUBLICATIONS

English translation of description and claim 1 of CN-112981535-A.*

Zalieckas, Justas, et al., "Large area microwave plasma CVD of diamond using composite right/ left-handed materials". Diamond & Related Materials 116 (2021) 108394, pp. 1-6.*

Khan, M.A., et al., "Microwave plasma chemical vapor deposition of diamond films with low residual stress on large area porous silicon substrates". Thin Solid Films, vol. 332, Issues 1-2, Nov. 2, 1998, pp. 93-97.*

* cited by examiner

*Primary Examiner* — Bret P Chen

(74) *Attorney, Agent, or Firm* — Gencorp PC; Max Snow

(57) ABSTRACT

A method includes inserting a composite substrate into a reactor, where the composite substrate has a transverse coefficient of thermal expansion matching the transverse coefficient of thermal expansion of diamond throughout the range of 20 to 600 deg. C.; growing a layer of diamond upon a composite substrate via microwave plasma chemical vapor deposition. The composite substrate includes a deposition layer embedded within a base layer that is at least 6,000 times thicker than the deposition layer.

18 Claims, 8 Drawing Sheets

DIAMOND GROWTH ON COMPOSITE SUBSTRATE

PRIORITY

Priority is claimed to U.S. Provisional Application No. 63/512,492 to Pinneo (filed on Jul. 7, 2023, which is hereby incorporated by reference.

FIELD

Among other things, the present document describes chemical vapor deposition of diamond on a composite substrate. The substrate can include a thick base layer and a thin deposition layer. The base layer can be composed of a material suitable to match the thermal expansion of diamond and the deposition layer can be composed of a material suitable to host diamond growth, such as silicon, tungsten, or molybdenum. The deposition layer can be microscopically thin in comparison with the base layer.

BACKGROUND

U.S. Pat. No. 5,449,412 describes chemical vapor deposition ("CVD") of diamond through microwave plasma assisted chemical vapor deposition ("MPCVD"). A microwave power source, typically operating at a frequency 0.915 or 2.54 GHz, energizes a mixture of methane and hydrogen gas into a plasma. The mixture may include additional gas precursors such as oxygen, nitrogen, and argon. Electrical fields from the microwave power source dissociate the hydrogen into excited species, which extract hydrogen atoms from methane until an isolated carbon atom remains. The isolated carbon atom then joins the substrate in a crystalline orientation.

U.S. Pat. Nos. 5,432,003 and 5,271,971 set out predeposition surface treatments for a substrate. Additional techniques for growing diamond through CVD are described in U.S. Pat. Nos. 4,849,199, 5,449,412, 5,607,723, and 6,656,444. As described in U.S. Pat. No. 5,273,825, diamond grown through chemical vapor deposition exhibits exceptional thermal conductivity and is uniquely suited to cool high-power electronics.

SUMMARY

A method includes inserting a composite substrate into a reactor, where the composite substrate has a transverse coefficient of thermal expansion matching the transverse coefficient of thermal expansion of diamond throughout the range of 20 to 600 deg. C.; growing a layer of diamond upon a composite substrate via microwave plasma chemical vapor deposition. The composite substrate includes a deposition layer embedded within a base layer that is at least 2000 times thicker than the deposition layer.

A composite substrate for nucleating polycrystalline diamond includes a base layer and a deposition layer sputter embedded in the base layer. The base layer includes graphite. The deposition layer includes silicon, tungsten, or molybdenum. The base layer is at least 5 mm thick while the deposition layer is less than 1 micron thick.

Other examples of the disclosed inventions appear in the specification and drawings.

BRIEF DESCRIPTION OF THE DRAWINGS

FIG. 2 can occur at the same time as FIG. 1. The sizes of the diamond particles/nucleation sites are greatly exaggerated.

FIG. 3 can have occurred at an earlier point in time than FIG. 1.

FIG. 4 can have occurred at a later point in time than FIG. 1 and can correspond to the coated substrate during CVD or to the coated substrate after CVD.

FIG. 5 can occur at the same time as FIG. 4.

FIG. 6 can occur at the same time as any of FIG. 1, FIG. 3, or FIG. 4.

FIG. 7 can occur at the same time as FIG. 6.

DETAILED DESCRIPTION OF EXEMPLARY EMBODIMENTS

Figure 13A:
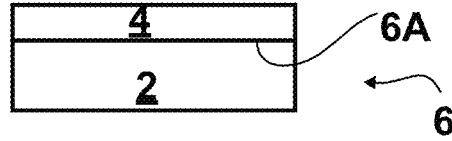
FIG. 13A is a cross-sectional elevational view of a coated unitary substrate.

FIG. 13A is a schematic elevational view of a coated substrate 6 composed of a substrate 2 and a diamond coating 4 deposited thereon. Substrate 2 can be a graphite-silicon composite including, or consisting of, a thick layer of pure graphite and a thin layer of sputter-coated silicon. Diamond coating 4 can be polycrystalline diamond grown on substrate 2 through CVD such as MPCVD.

Once MPCVD ends, coated substrate 6 can cool from deposition temperature-typically at least 600 deg. C.-to room temperature-about 20 deg. C.-causing substrate 4 and diamond 6 to thermally contract or shrink. If substrate 2 were to expand or contract significantly faster than diamond 4, then stress at substrate/diamond interface 6A may fully or partially shear substrate 2 from diamond 4. An unintended, premature, or unwanted, or separation between substrate 2 and diamond 4 is called an unintended delamination or a delamination failure.

Figure 13B:
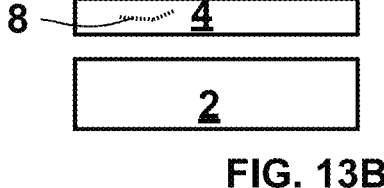
FIGS. 13B and 13C are cross-sectional elevational views of the coated unitary substrate of FIG. 13A after a delamination failure. Hidden internal fractures are shown in broken lines.
Figure 13C:
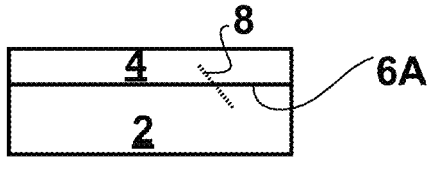

Referring to FIGS. 13B and 13C, a delamination failure can cause cracking 8 within diamond 20, impairing its mechanical, thermal, electrical, and optical performance. In FIG. 13B, a delamination failure has fully cleaved diamond 4 from substrate 2 and created an internal crack 8. In FIG. 13C, a delamination failure has partially cleaved substrate 2 from diamond 4 and created a crack 8 extending from diamond 4 through substrate 2. If crack 8 is microscopic, then a delamination failure can go undetected until diamond 4 enters service downstream as a heat sink, an optical window, etc. Cracks 2 generated by uncontrolled delamination can range from virtually undetectable to catastrophic fragmentation of the deposited diamond layer 4.

A delamination failure can happen at any point in a growth cycle, including reactor/deposition startup, steady-state deposition, reactor/deposition shutdown, and post-shutdown cooling. The price of a delamination failure rises during growth because the time, energy, and precursor gas resources invested in diamond 4 are sunk costs. As shown in FIG. 13C, a delamination failure can also impair substrate 2, which is particularly undesirable when substrate 2 is made from an expensive metal such as molybdenum or tungsten. In contrast to an unintended delamination, an intended or controlled delamination will preserve the structural integrity of diamond 4.

Referring to FIGS. 1-12 and 14, substrate 10 can be configured as a composite to significantly reduce the chances of unintended delamination. Substrate 10 can include a lower or diamond-remote layer such as base layer 110, which can be configured to reduce stress at substrate-diamond interface by matching the thermal expansion/contraction of diamond 20. Substrate 10 can include an upper or diamond-adjacent layer such as deposition layer 120, which can be configured to host nucleation of diamond 20 during CVD. To achieve these objectives, base layer 110 can be composed of graphite and deposition layer 120 can be composed of a microscopically thin layer of a material adapted to host diamond nucleation sputter coated onto base layer 110. For example, deposition layer 120 can be a thin film of silicon, molybdenum, tungsten, or diamond.

Employing a composite structure to isolate or space base layer 110 from diamond 20, examples of which are shown in FIGS. 1-12, enables substrate 10 to include and/or almost entirely consist of a material with a transverse linear coefficient of thermal expansion ("CTE") matching the CTE of diamond within the range of 20-600 deg. C. For example, the CTE of the material can be 50-200% of the CTE of diamond throughout 20-600 deg. C., irrespective of the material's capacity to nucleate diamond growth. CTEs are further discussed below.

Thus, in the examples of FIGS. 1-12, base layer 110 can have a desirable CTE and undesirable diamond nucleation properties, while deposition layer 120 can have an undesirable CTE and desirable diamond nucleation properties. To enhance the respective objectives of the layers, base layer

110 can comprise the vast majority of substrate 10 (e.g., at least 0%, 95%, 99%, or 99.9% by mass, volume, or thickness) while deposition layer 120 can be a thin (e.g., less than 5 micron, less than 1 micron, or 10-500 nm (e.g., 10-50 nm)) coating affixed to base layer 110.

Base layer 110 can be composed of a material with a CTE within 1, 5, 10, 20, 50, 100, 200, or 250% of the CTE of diamond 20 throughout 20-600 deg. C. Base layer 110 can include (e.g., comprise, consist essentially of, and/or consist of) graphite that is at least 90%, 95%, 99%, or 99.9% pure by mass. As discussed below, base layer 110 can include (e.g., comprise, consist essentially of, and/or consist of) other materials. Deposition layer 120 can include (e.g., comprise, consist essentially of, and/or consist of) silicon, tungsten, or molybdenum that is at least 90%, 95%, 99%, or 99.9% pure by mass.

Deposition layer 120 can be applied to base layer 110 via sputter coating or another thin film deposition process such as ion beam implantation. Advantageously, sputter coating can embed deposition layer 120 within base layer 110 such that particles in deposition layer 120 partially intrude into the volume of base layer 110 across the surface area of deposition layer 120. Beyond adhering deposition layer 120 to base layer 110, the embedding can cause deposition layer 120 to adopt or reflect, at least partially, the thermal expansion behavior of the base layer 110. This enables base layer 110 to dictate or dominate the CTE of substrate 10 at substrate-diamond interface 30 even when base layer 110 has been isolated or separated from substrate-diamond interface 30 by an intervening deposition layer 120.

The linear coefficient of thermal expansion ("CTE") is an inherent material property that quantifies the extent of expansion/contraction along each coordinate axis in response to heating/cooling. The CTE of known materials crosses several orders of magnitude and can be expressed in parts-per-million ("ppm") per deg. C. Because diamond 20 extends across the surface area of substrate 10 in the example of FIG. 2A, thermal expansion in the transverse direction (along the X and Y axes) as opposed to the longitudinal direction (along the Z axis) will dominate internal shear stress at substrate/diamond interface 40. Thus, the CTEs discussed herein will be transverse unless otherwise noted.

The CTE of polycrystalline diamond is 1.5-2.5 ppm per deg. C. at 20 deg. C. and rises by 1.5-2.5 ppm when heated to 600 deg. C. See [R.1]. The CTE of graphite (e.g., ATJ grade graphite) is 1.5-3.5 ppm per deg. C. at 20 deg. C. and rises by 0.5-1.2 ppm per deg. C. when heated to 600 deg. C. See [R.2]. The CTE of silicon is 2.4-3 ppm per deg. C. at 20 deg. C. and rises by 1.3-2 ppm per deg. C. when heated to 600 deg. C. See [R.3].

Taking the averages of the reported ranges, the CTE of polycrystalline diamond is 2.0 ppm per deg. C. at 20 deg. C. and 4.0 ppm per deg. C. at 600 deg. C.; the CTE of graphite is 2.5 ppm per deg. C. at 20 deg. C. and 3.35 ppm per deg. C. at 600 deg. C.; and the CTE of silicon is 2.7 ppm per deg. C. at 20 deg. C. and 4.35 ppm per deg. C. at 600 deg. C.

Although the CTE of graphite is not a perfect match for the CTE of polycrystalline diamond, it is a match sufficient (e.g., $\frac{1}{2} \leq CTE graphite/CTE polycrystalline diamond=2$, throughout 20-600 deg. C.) to significantly reduce the chances of a thermally induced delamination failure in comparison to a unitary substrate (see FIGS. 13A-13C) composed of silicon, tungsten, or molybdenum. Because CTEs extend across several orders of magnitude and index a differential length, as opposed to an absolute length, CTEs within 50-200% of each other can be highly compatible.

As the coefficient of thermal expansion of pure graphite matches the coefficient of thermal expansion of diamond throughout 20-600 deg. C., substrate 10 and diamond coating 20 expand and shrink in concert while cooling from deposition temperature to room temperature, reducing stress at substrate-diamond interface 30 and the possibility of delamination failure.

Two other features may contribute to the advantageous thermal performance of graphite. First, both CTEpolycrystalline diamond and CTEgraphite can be linear functions of temperature at 20-600 deg. C., whereas the CTEs of alternatives such as silicon, tungsten, and molybdenum are often a non-linear function of temperature at 20-600 deg. C. See [R.4], [R.5].

Second, an inversion can occur between the CTE of graphite and the CTE of diamond when heated from 20 deg. C. to 600 deg. C. and when cooled from 600 deg. C. to 20 deg. C. When the coated substrate begins cooling from deposition temperature (e.g., usually at least 600 deg. C. at substrate-diamond interface 30) to 20 deg. C., the diamond can shrink faster than the graphite due to the CTE of diamond exceeding the CTE of graphite at 600 deg. C.

At some point between 600 deg. C. and 20 deg. C., (e.g., 200-450 deg. C.), the CTEs of diamond and graphite can invert in magnitude such that the graphite begins to shrink faster than the diamond. The inversion between the CTEs of diamond and graphite between 20 deg. C. and 600 deg. C. promotes stability by cycling the materials between tensile and compressive stresses at interface 30. The inversion further tends to limit the absolute difference in volume between the bodies by causing the absolute difference in volume to reach a local minimum of zero at a point between 20 deg. C. and 600 deg. C.

As shown in FIGS. 1-12, base layer 110 can be a circular plate of pure graphite, such as ATJ-grade graphite. Properties of ATJ-grade graphite are identified in GrafTech Intl., ATJ Graphite, GT-5028/Rev. 2 (2009), which is hereby incorporated by reference.

To refine the CTE match between base layer 110 and diamond 20, base layer 110 can be a mixture of materials such as graphalloy (graphite infused with metal such as graphite infused with tungsten, molybdenum, invar, or tungsten); a compound of a metal and carbon such as tungsten carbide or steel (e.g., SVCM shock resistant steel); an alloy such as invar (a nickel-iron alloy) or a silicon-metal alloy; and a ceramic such as porcelain, zerodur, or glass (e.g., borosilicate glass).

Deposition layer 120 can be a material adapted to host diamond nucleation. Deposition layer 120 can include or consist of silicon sputter coated or ion implanted onto base layer 110. The silicon can be at least 90%, 95%, 99%, or 99.9% pure by mass. It has been found that sputter coating or ion implanting deposition layer 120 onto base layer 110 often creates superior conditions for nucleating polycrystalline diamond than melting or mechanically fastening deposition layer 120 onto base layer 110.

Deposition layer 120 can intrude 0.1-5 nm into base layer 110. As described above, so embedding the deposition layer 120 within the base layer 110 via sputter coating is believed to encourage deposition layer 120 to adopt, at least in part, the CTE of base layer 110. As such, it is possible for the deposition layer 120 to include (e.g., consist of) tungsten, molybdenum, titanium, chromium, silicon carbide, or another material with diamond nucleation properties instead of silicon. If diamond coating 20 is intended to be monocrystalline instead of polycrystalline, then deposition layer 120 can be composed of single-crystal diamond and application of slurry 230 can be skipped.

Figure 3:
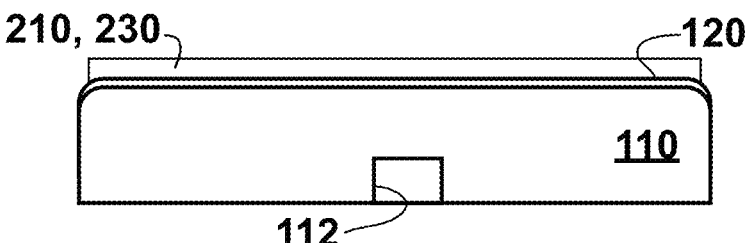
FIG. 3 is a cross-sectional elevational view of composite substrate of FIG. 1, while the composite substrate was being seeded.
Figure 4:
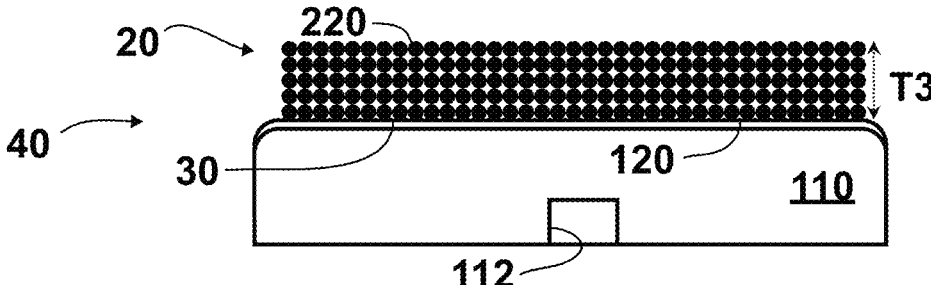
FIG. 4 is a cross-sectional elevational view of the composite substrate of FIG. 1, after CVD has grown a diamond coating thereon.
Figure 5:
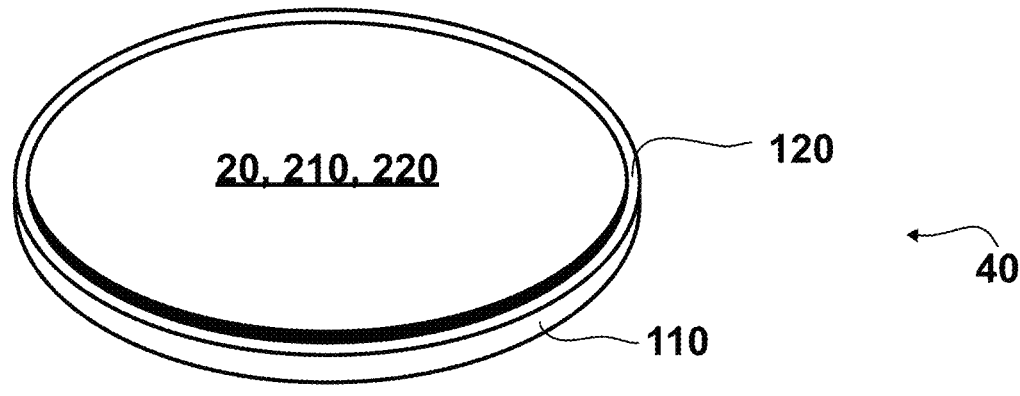
FIG. 5 is an isometric view of the composite substrate of FIG. 1, after CVD of a diamond coating thereon.

Referring to FIG. 3, a slurry 230 including diamond particles suspended in a volatile liquid base can be spread across all, or a portion of, deposition layer 120 to create a nucleation zone 210. Once the liquid base evaporates, the nucleation zone 210 can be populated by residual diamond particles or grains 212, which will nucleation sites for diamond coating 20.

Slurry 230 can include (e.g., includes and/or consists of) 0.05-0.3 micron diamond dust (e.g., 0.1 micron diamond dust) suspended in isopropyl alcohol. In slurry 230, the ratio of diamond dust to liquid base can be 1 gram of diamond dust per 30-300 mL of isopropyl alcohol (e.g., 1 gram of 0.1 micron diamond dust per 100 mL of isopropyl alcohol).

Exposed edges attract the electrical fields generated during MPCVD, devolving plasma uniformity. To combat plasma nonuniformity, and as shown in FIGS. 1-12, upper perimeter 114U of base layer 110 (labeled in FIG. 2) can be filleted to round away the sharp 90 deg. edge that would otherwise exist at the outer perimeter. Upper perimeter 114U of base layer 110 can be filleted before base layer 110 receives deposition layer 120. The radius of curvature of the fillet can be at least 0.5 mm (e.g., at least 1.0 mm or 0.8-3 mm). Lower perimeter 114L of base layer 110 can be non-filleted to discourage gas from infiltrating the interface between base layer bottom surface 118 and stage 520.

Figure 6:
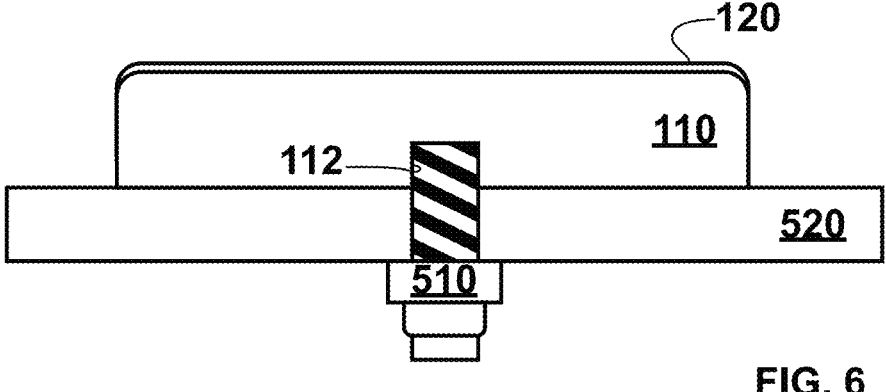
FIG. 6 is a cross-sectional elevational view of the composite substrate of FIG. 1 after being fastened to the stage of a reactor. The nucleation zone and any diamond growth are omitted.

Before or after sputter coating, one or more blind bores 112 can be cut into base layer 110. At least one blind bore 112 can be disposed along the axial centerline of base layer 110, as shown in FIGS. 1-6 and 8-12. Referring to FIG. 6, each blind bore 112 can be threaded to receive a fastener 500, such as a screw while the other end of fastener 510 can affixed to the MPCVD reactor by way of reactor stage 520 (also called a carrier or holder), which supports substrate 10 during CVD.

Figure 7:
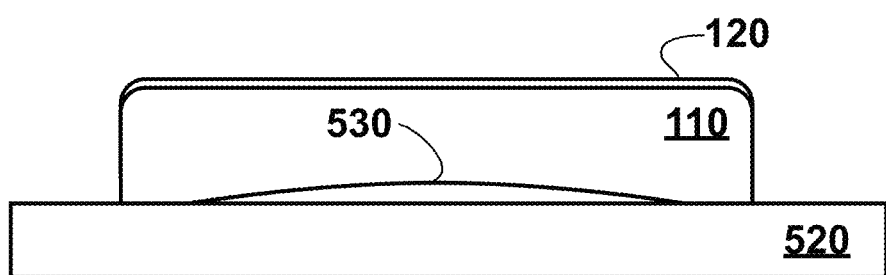
FIG. 7 is a cross-sectional elevational view of the composite substrate and stage of FIG. 6, modified to exclude any mechanical attachment between the substrate and stage.

Mechanically securing substrate 10 to stage 520 can be performed to accomplish one or both of the following objectives: First, to prevent substrate 10 from bowing or upwardly flexing 530 away from stage 520, as shown in FIG. 7. Second, to rotate substrate 10 about the longitudinal axis and/or translate in the transverse direction with stage 520 during growth to enhance deposition uniformity. Reactor stage 520 can be configured to vertically translate (e.g., lower), rotate about the longitudinal axis, and/or translate in the transverse direction during MPCVD. In other examples, stage 520 remains in a constant position throughout MPCVD.

Figure 8:
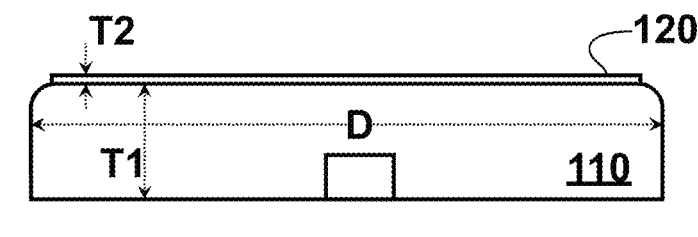
FIG. 8 is a cross-sectional elevational view of the composite substrate of FIG. 1, modified to confine the deposition layer to the flat portion of the upper surface of the base layer. The nucleation zone is omitted. The dimensions discussed with reference to FIG. 8 can be common to any of FIGS. 1-6 and 9-12.

Deposition layer 120 in FIGS. 1-7 can have the geometry shown in FIG. 8, FIGS. 9 and 10, or FIGS. 11 and 12. In FIG. 8, deposition layer 120 covers the non-filleted portion of the top surface of base layer 110. If delamination failures are common (e.g., the rate of delamination failures exceeds a predetermined threshold), then the surface area of deposition layer 120 can be expanded to cover additional surface area of base layer 110 as shown in FIGS. 9-12.

Figure 9:
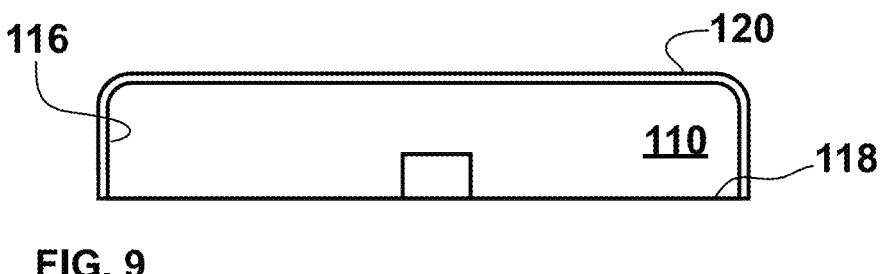
FIG. 9 is a cross-sectional elevational view of the composite substrate of FIG. 1, modified to expand the deposition layer to cover the outer side wall of the base layer. The nucleation zone is omitted.
Figure 10:
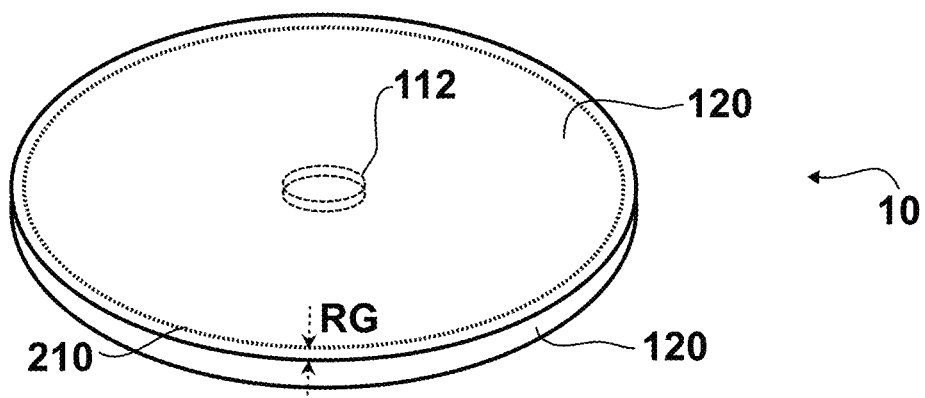
FIG. 10 is an isometric view of the composite substrate of FIG. 9, including the nucleation zone.
Figures 11, 12:
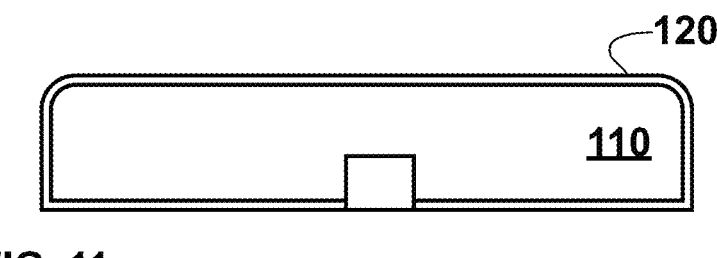
FIG. 11 is a cross-sectional view of the composite substrate of FIG. 9, modified to expand the deposition layer to the bottom surface of the base layer. The nucleation zone is omitted.
FIG. 12 is an isometric view of the composite substrate of FIG. 11, including the nucleation zone.

In FIGS. 9 and 10, deposition layer 120 covers sidewall 116 but not bottom 118 of base layer 110. In FIGS. 11 and 12, deposition layer 120 fully covers the outer surface area of base layer 110, including sidewall 116 and bottom 118, except at the one or more blind bores 112. The expanded surface area of deposition layer 120 in FIGS. 9-12 can enhance structural integrity of substrate 10 without changing the location of diamond deposition from substrate 10 in FIGS. 1-6. Thus, deposition zone 210 can retain a constant geometry (size and shape) even when the size of deposition layer 120 changes, as illustrated by the geometry of deposition zone 210 remaining constant across FIGS. 2, 10, and 12.

Referring to the dimensions of FIGS. 1-12, and as labeled in FIG. 8, base layer 110 can have a transverse diameter D of 50-400 mm, a longitudinal thickness T1 of 4-20 mm, and a radius of curvature RC at fillet 114 greater than or equal to 0.8 mm, while deposition layer 120 can have a thickness T2 less than or equal to 2.0 microns (e.g., 0.01-1.5 microns). The outer perimeter of nucleation zone 210 can be transversely spaced from outer sidewall 116 of base layer 110 by a radial gap RG (see FIGS. 1 and 2), which can be 0-30 mm (e.g., 0.8-10 mm).

Returning to FIG. 8, base layer 110 can have a transverse diameter D of 100-250 mm, a longitudinal thickness T1 of 8-14 mm, and a radius of curvature RC at fillet 114 of 0.9-2.5 mm, while deposition layer 120 can have a thickness T2 less than or equal to 0.7 micron (e.g., 10-200 nm). As labeled in FIG. 4, diamond layer 20 can have a thickness T3 of 0.3-2.5 mm (e.g., 0.25-1.1 mm or 0.25-0.8 mm).

Figure 14:
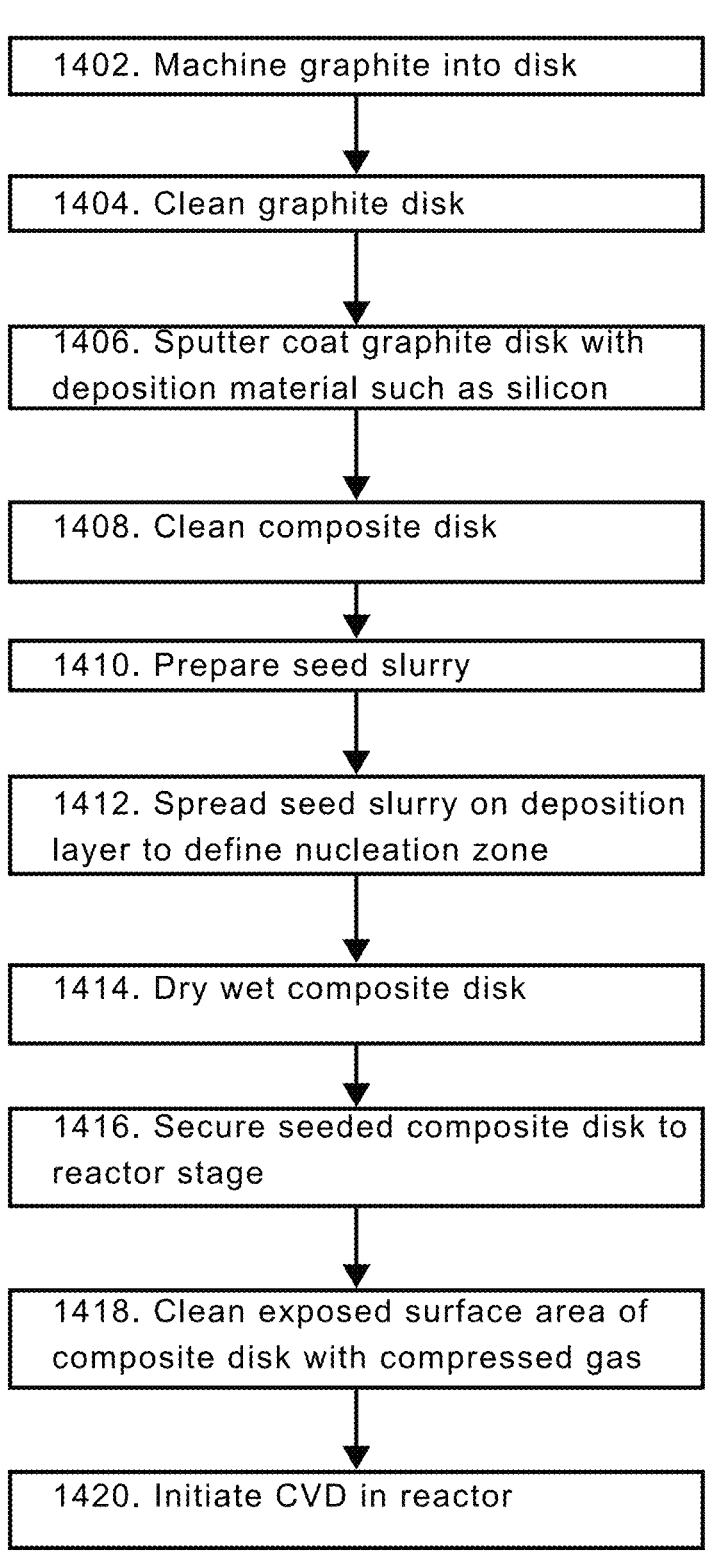
FIG. 14 is a method of making the substrate of FIGS. 1-12.

FIG. 14 is an exemplary method of preparing substrate 10 for diamond deposition.

At block 1402, pure graphite (e.g., ATJ-grade graphite) can be machined or molded into a disk. The disk upper outer perimeter of the disk can be filleted. At block 1404, the graphite disk, corresponding to base layer 110, can be cleaned through immersion an ultrasonic bath of isopropyl alcohol and/or an ultrasonic bath of deionized water. At block 1406, the graphite disk can be sputter coated with pure silicon to create the composite substrate shown in FIGS. 1-12.

Figure 1:
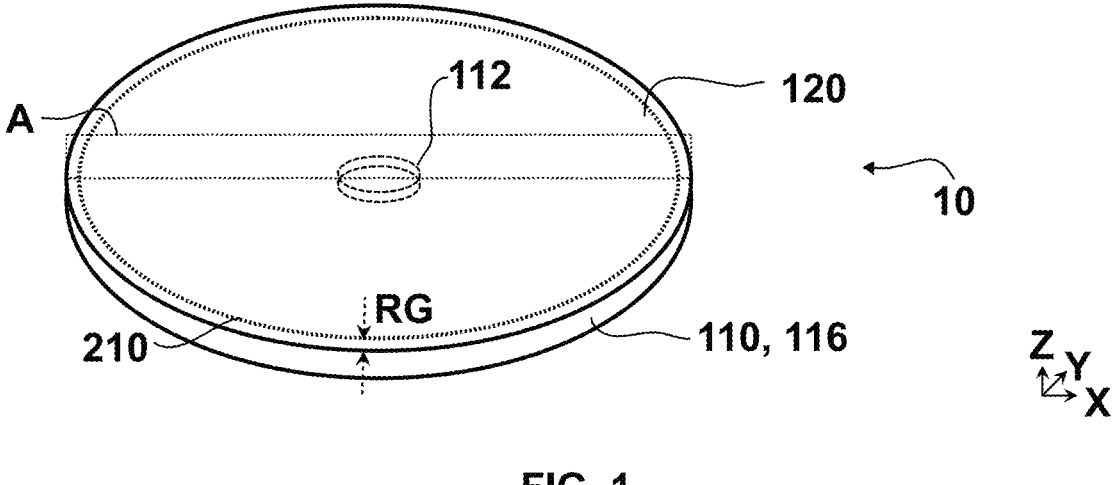
FIG. 1 is an isometric view of a seeded composite substrate. The cross-sectional elevational views described below are from a perspective corresponding to plane A in FIG. 1, although some occur at different points in time than FIG. 1.
Figure 2:
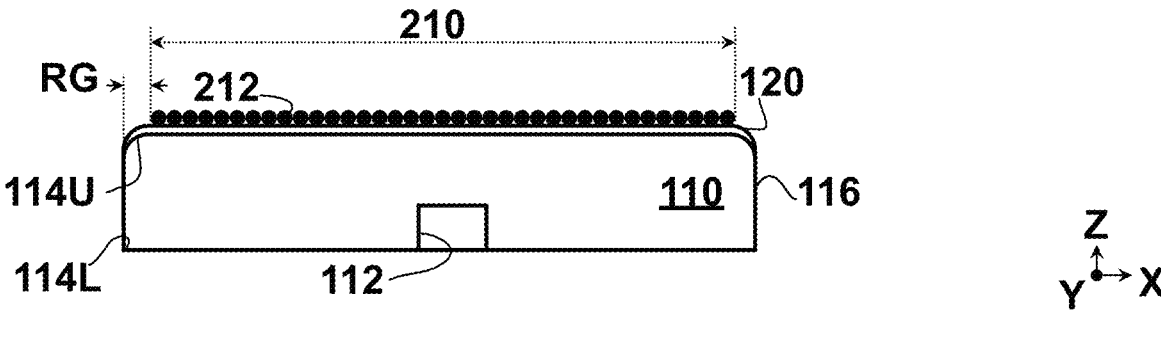
FIG. 2 is a cross-sectional elevational view of the seeded composite substrate of FIG. 1.

At block 1408, the composite substrate can be cleaned through immersion in an ultrasonic bath of isopropyl alcohol and/or an ultrasonic bath of deionized water. At block 1410, slurry 230 can be prepared by mixing diamond particles 212 into a base of isopropyl alcohol. At block 1412, slurry 230 can be spread across the flat (non-filleted) portion of the composite disk corresponding to nucleation zone 210, as shown in FIG. 3. At block 1414, the wetted composite disk can dry in pure air or nitrogen. During block 1414, the isopropyl alcohol can evaporate, leaving behind diamond particles to nucleate new diamond growth on nucleation zone 210, as shown in FIGS. 1, 10, and 12.

At block 1416, the seeded composite can be placed on the stage 520 of a CVD reactor, such as an MPCVD reactor. During block 1416, the seeded composite can be mechanically secured to the stage, as shown in FIG. 7 via fastener 510. At block 1418, the seeded surface of the composite can be cleaned, while resting on the stage, by spraying the seeded surface with compressed air or nitrogen. At block 1420, the reactor can be sealed and energized to initiate growth of diamond coating 20 upon the deposition zone 210.

Figure 15:
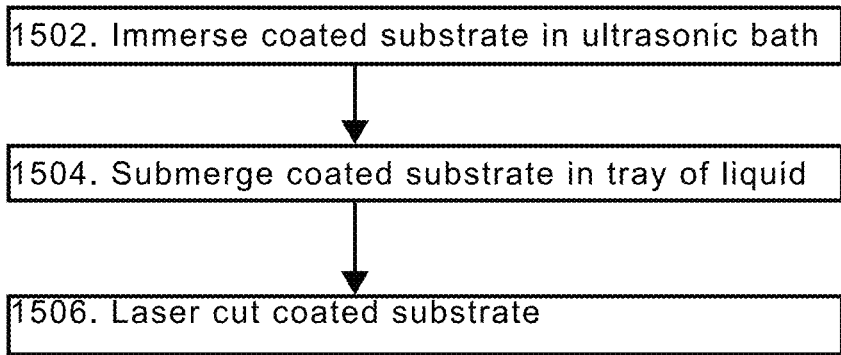
FIG. 15 is a method of performing an intended delamination after the substrate of FIGS. 1-12 has been coated with a layer of diamond.

FIG. 15 is a method of performing a controlled delamination of coated substrate 40. At block 1502, coated substrate 40 can be immersed in an ultrasonic batch of deionized water. At block 1504, coated substrate 40 can be placed in a tray of liquid such that the top of coated substrate 40 is submerged under at least 1 mm, 2 mm, 4 mm, or 10 mm of liquid. At block 1506, coated substrate 40 can be laser cut while submerged in the liquid. The energy absorbed by coated substrate 40 during laser cutting can cause diamond coating 20 to cleanly delaminate from substrate 10.

The liquid can include deionized water and a surfactant. For example, the liquid can be a mixture of deionized water and dish soap at a ratio of 1000 mL water:0.01-10 mL of dish soap, where the dish soap is composed of 3-30% surfactant by mass. The surfactant can be an anionic surfactant such as a sulfate, sulfonate, phosphate, or carboxylate. Examples of anionic surfactants include sodium lauryl sulfate and sodium laureth sulfate, as found in Dawn Dish Soap®.

Example 1. A method of growing diamond can include: fastening a substrate to a stage of a reactor; and growing a layer of polycrystalline diamond upon the substrate via microwave plasma chemical vapor deposition. The substrate can be a composite including a thin upper layer embedded within a thick lower layer.

The method of example 1 can further include the following features:

The lower layer can have a transverse linear coefficient of thermal expansion of less than 3.5 ppm per deg. C. at 20 deg. C. and the upper layer can be configured to host nucleation of diamond. The upper layer can have a thickness less than 3 microns and the lower layer has a thickness in the range of 6-17 millimeters.

The substrate can be a disk with a filleted upper perimeter. The lower layer can define a top surface and a side surface. The top layer can be embedded within both the top surface and the side surface. The top surface of the lower layer can be flat while the side surface of the lower layer is curved. The layer of polycrystalline diamond can grow upon the upper layer without contacting the lower layer. The layer of polycrystalline diamond can grow on a limited portion of the upper layer.

The lower layer can define a blind bore and a fastener can interface with the blind bore to secure the substrate to the stage of the reactor. The upper layer and the lower layer can intersect along a transversely extending plane.

A layer of polycrystalline diamond can be produced according to the method of example 1.

Example 2. A method can include: determining that a first composite substrate has experienced a delamination failure, where the first composite substrate includes a first base layer and a first deposition layer and the first deposition layer covers a first percentage of the first base layer; in response to determining that the first composite substrate has experienced the delamination failure, making a second composite substrate, where the second composite substrate includes a second base layer and a second deposition layer and the second deposition layer covers a second percentage of the second base layer; and where, in response to determining that the first composite substrate has experienced the delamination failure, the second percentage is made to exceed the first percentage such that the second deposition layer covers a greater percentage of the second base layer than the first deposition layer covers of the first base layer.

The method of example 2 can further include the following features: the first deposition layer can define a first nucleation zone, the second deposition layer can define a second nucleation zone, and the first nucleation zone can be equal in size to the second nucleation zone.

Example 3. A composite substrate for nucleating polycrystalline diamond during chemical vapor deposition can include: a base layer including graphite; and a deposition layer including at least one of silicon, tungsten, titanium, and molybdenum. The base layer can be at least 6 mm thick and the deposition layer can be less than 3 microns thick.

The substrate of example 3 can further include the following features: The base layer can define a blind bore that does not intersect the deposition layer. The deposition layer can have been sputter coated onto the base layer such that the deposition layer penetrates into the base layer. The deposition layer can have been sputter coated onto the base layer such that the deposition layer penetrates less than 5 nm into the base layer.

The substrate of example 3 can include any of the features of the substrate of example 1. The method of example 1 can use the substrate of example 3.

Example 4. A seeded composite substrate can include: the composite substrate of example 3; and a nucleation zone on the deposition layer, where the nucleation zone is populated with microscopic particles of diamond.

Example 5. An assembly can include the seeded composite substrate of example 4, a stage of a chemical vapor deposition reactor, and a fastening assembly securing the composite substrate to the stage of the reactor. At least a portion of the fastening assembly can be disposed within a bore defined in the base layer.

Example 6. A composite substrate for nucleating polycrystalline diamond can include: a base layer; and a deposition layer sputter coated onto the base layer. The substrate of example 6 can further include the following features:

The base layer can include graphite and the deposition layer can include silicon, tungsten, or molybdenum. The base layer can be at least 5 mm thick and the deposition layer can be less than 1 mm thick. The base layer can define a bore configured to receive a set screw extending from the stage of a reactor. The deposition layer can be embedded within the base layer by less than 5 nm. The graphite can be pure.

The substrate of example 6 can include any of the features of the substrates of examples 1 and 3. The substrate of example 6 can be used in the methods of examples 1 and 2.

Examples of the present inventions are shown in the drawings and described in detail. The inventions are not limited to these examples. Instead, the inventions include all modifications, alternative constructions, and equivalents falling within the spirit and scope of the appended claims.

[R.1]: Moelle et al., Diam. Relat. Mater. 6 (1997) 839-842; Element Six, Diamond Handbook (March 2021). [R.2]: General Atomics, DOE-HTGR-88111 Rev. 0 (1988); Hidnert et al., Thermal Expansion of Graphite (February 1927); GrafTech GT-5028 Rev. 2 (2009). [R.3]: Virginia Semiconductor, Basic Mechanical and Thermal Properties of Silicon (undated). [R.4]: White et al., Intl. J. Thermophys. 18:5 (1997) 1269-1327. [R.5]: Hidnert et al., Thermal Expansion of Molybdenum (1924).

The invention claimed is:

1. A method comprising:
placing a composite substrate in a reactor;
growing a layer of diamond upon a composite substrate via microwave plasma chemical vapor deposition;
wherein the composite substrate includes an upper layer embedded within a lower layer, the lower layer being at least 4,000 times thicker than the upper layer;
cycling the grown diamond and the composite substrate between tensile and compressive stresses at an interface between the grown diamond and the composite substrate before delaminating the grown diamond from the composite substrate; and
wherein the lower layer is 6 to 17 mm thick, the upper layer is less than one micron thick, the lower layer has a coefficient of thermal expansion of less than 3.5 ppm per deg. C. at 20 deg. C. and the upper layer includes diamond.

2. The method of claim 1, wherein the lower layer includes silicon embedded in graphite.

3. The method of claim 2, wherein the grown diamond is polycrystalline.

4. The method of claim 2, wherein the silicon protrudes into the graphite by less than five nanometers.

5. The method of claim 1, wherein the lower layer of the composite substrate defines a blind bore by which the composite substrate is affixed to a rotatable stage of the reactor.

6. The method of claim 1, wherein the lower layer includes a thin silicon layer and a thick graphite layer.

7. The method of claim 1, wherein the lower layer is pure graphite, the upper layer is a film of diamond particles and a layer of silicon is disposed between the lower silicon layer and the upper diamond layer.

8. A method comprising:
inserting a composite substrate into a reactor, wherein the composite substrate has a transverse coefficient of thermal expansion matching the transverse coefficient of thermal expansion of diamond throughout the range of 20 to 600 deg. C.;
growing a layer of diamond upon a composite substrate via microwave plasma chemical vapor deposition;
wherein the composite substrate includes a deposition layer embedded within a base layer that is at least 6,000 times thicker than the deposition layer.

9. The method of claim 8, wherein the base layer contributes at least 99.9% of the mass of the composite substrate and the deposition layer contributes less than 0.1% of the mass of the composite substrate.

10. The method of claim 8, comprising cycling the grown diamond and the composite substrate between tensile and compressive stresses at an interface between the grown diamond and the composite substrate.

11. The method of claim 10, wherein the embedding of the deposition layer in the base layer causes the deposition layer to emulate the coefficient of thermal expansion of the base layer.

12. The method of claim 11, wherein the upper perimeter of the base layer is filleted to discourage electrical fields from concentrating along the upper perimeter.

13. The method of claim 12, wherein the deposition layer is embedded within the filleted portion of the upper perimeter of the base layer.

14. The method of claim 13, wherein the base layer defines a top surface, a bottom surface, and a sidewall, the fillet being disposed along the edge between the top surface and the sidewall, the deposition layer being embedded within the top surface and the sidewall.

15. The method of claim 14, wherein a threaded blind bore extends through the base layer via the bottom surface.

16. The method of claim 15, wherein the upper layer protrudes into the lower layer by less than five nanometers.

17. The method of claim 8, wherein the base layer comprises graphite and is at least 10,000 times thicker than the deposition layer.

18. A method comprising:
inserting a composite substrate into a reactor, wherein the composite substrate has a transverse coefficient of thermal expansion matching the transverse coefficient of thermal expansion of diamond throughout the range of 20 to 600 deg. C.;
growing a layer of diamond upon a composite substrate via microwave plasma chemical vapor deposition; and
cycling the grown diamond and the composite substrate between tensile and compressive stresses at an interface between the grown diamond and the composite substrate.

* * * * *